United States Patent [19]

Kitchin et al.

[11] Patent Number: 4,824,770
[45] Date of Patent: Apr. 25, 1989

[54] CONTINUOUS TONE COLOR IMAGING USING LASER OR LIGHT EMITTING DIODE SOURCES

[75] Inventors: Jonathan P. Kitchin, Hertford; Stephen R. Powers, Harlow; Keith A. Penfound, Saffron Walden; Peter J. Finn, Harlow, all of England

[73] Assignee: Minnesota Mining and Manufacturing Company, St. Paul, Minn.

[21] Appl. No.: 36,078

[22] Filed: Apr. 9, 1987

[30] Foreign Application Priority Data

Apr. 15, 1986 [GB] United Kingdom ............... 8609133

[51] Int. Cl.⁴ .................... G03C 5/16; G03C 7/26; G03C 7/28
[52] U.S. Cl. .................... 430/363; 430/333; 430/338; 430/339; 430/503; 430/508; 430/509; 430/944; 430/945
[58] Field of Search ............ 430/509, 363, 333, 338, 430/944, 945, 505, 508, 358

[56] References Cited

U.S. PATENT DOCUMENTS

| | | | |
|---|---|---|---|
| 4,416,522 | 11/1983 | Webster | 354/4 |
| 4,469,779 | 9/1984 | Suits | 430/363 |
| 4,619,892 | 10/1986 | Simpson et al. | 430/505 |
| 4,684,602 | 8/1987 | Lelental et al. | 430/363 |

OTHER PUBLICATIONS

Circuits Manufacturing, "Laser Exposes PCB's" Decker et al., Dec. 1979, pp. 18–24.

*Primary Examiner*—Paul R. Michl
*Assistant Examiner*—Mark R. Buscher
*Attorney, Agent, or Firm*—Donald M. Sell; Walter N. Kirn; Mark A. Litman

[57] ABSTRACT

A process for producing a continuous tone color image comprising providing a light sensitive photographic element comprising a substrate bearing three imaging media coated thereon, said imaging media comprising:
(1) an imaging medium capable of forming a yellow image upon imagewise exposure and processing,
(2) an imaging medium capable of forming a magenta image upon imagewise exposure and processing,
(3) an imaging medium capable of forming a cyan image upon imagewise exposure and processing, each imaging medium having a maximum spectral sensitivity at a wavelength different from that of the maximum spectral sensitivity of the other imaging media within the range 550 to 900 nm, the sensitivities at the wavelength of maximum spectral sensitivity of the media decreasing in order from the medium of shortest wavelength maximum spectral sensitivity to the medium of longest wavelength maximum spectral sensitivity, the difference in said sensitivities between the media of shortest and longest wavelength maximum spectral sensitivity being greater than 0.8 log exposure units, exposing said element to three independently modulated sources each emitting radiation of a wavelength in the region of the wavelength of maximum sensitivity of a respective imaging medium, the maximum emission intensities of the sources at the wavelength of their maximum output increasing from the source of shortest wavelength to longest wavelength by an amount corresponding to the sensitivity difference of the imaging media, said exposures being conducted in scanning fashion and over a number of discrete exposure levels.

17 Claims, No Drawings

CONTINUOUS TONE COLOR IMAGING USING LASER OR LIGHT EMITTING DIODE SOURCES

FIELD OF INVENTION

This invention relates to a continuous tone colour hard copy system in which a photographic element is exposed by three independently modulated sources e.g. to solid state lasers and light emitting diodes, the exposure being conducted in scanning e.g. raster fashion.

BACKGROUND TO THE INVENTION

Our copending British Application GB No. 2172118A discloses a system for producing colour proofs from electronically stored image data. In particular there is disclosed a radiation-sensitive element suitable for colour proofing comprising a substrate bearing at least four separate imaging media coated thereon, said imaging media including:
  (1) an imaging medium capable of forming a yellow image upon imagewise exposure and processing,
  (2) an imaging medium capable of forming a magenta image upon imagewise exposure and processing,
  (3) an imaging medium capable of forming a cyan image upon imagewise exposure and processing, and
  (4) an imaging medium capable of forming a black or a balancing black image upon imagewise exposure and processing,
each imaging medium having a maximum spectral sensitivity at a wavelength different from that of the maximum sensitivity of the other imaging media.

There is also disclosed a process for producing a coloured half-tone image comprising providing a light sensitive element comprising a substrate bearing three separate imaging media coated thereon, said imaging media consisting of:
  (1) an imaging medium capable of forming a yellow image upon imagewise exposure and processing,
  (2) an imaging medium capable of forming a magenta image upon imagewise exposure and processing, and
  (3) an imaging medium capable of forming a cyan image upon imagewise exposure and processing,
each imaging medium having a maximum spectral sensitivity at a wavelength different from that of the maximum spectral sensitivity of the other imaging media and a sensitivity at the wavelength of maximum spectral sensitivity of any of said other imaging media which is not significant compared to the maximum sensitivity of said other media, exposing said element to three independently modulated sources each emitting radiation of a wavelength corresponding to the waveength of maximum sensitivity of a respective imaging medium, said exposure being conducted in raster fashion.

In order to ensure that only the intended layer is exposed by any particular light source it is very desirable that the sensitive layers should exhibit high contrast or, more precisely, a very short exposure range from maximum density (Dmax) to minimum density (Dmin). A high photographic contrast is also a requirement for accurate recording of halftone images where it is desirable that exposure will generate either a full response or zero response. Preferably the sensitometric contrast of each imaging layer is sufficiently high that the difference between the exposure required to give a density which is 5% of the maximum density above fog and the exposure required to give a density which is 90% of the maximum density above fog is less than 1.5 log exposure units.

For the purposes of colour proof recording, there are several important advantages in producing the image in halftone form which are fully discussed in British Patent Application GB No. 2172118A. In particular halftone reproduction via electronically generated halftone dots gives a greater tolerance to variation in output of the exposing devices as well as to variations in the processing chemistry for the recording materials than would be the case for continuous tone recording. Image recording in halftone form also places much less stringent requirements on balancing the density and exposure characteristics and processing rates of the individual image forming layers.

These and other advantages follow from the nature of halftone recording which requires only maximum and minimum densities to be formed in the image layers. There is also a subjective advantage to proofing in halftone form since this is the structure of the final printed image as well as of the highest quality proofs which can be produced with present methods.

Although there are very good reasons for generating actual colour proofs in halftone format, images in this form are not suitable for re-scanning on a colour separation scanner should this be necessary.

There is a significant demand for colour hardcopy from electronically stored image data, output in a form which can be re-scanned. This arises from the demand for "second generation originals"; that is, original photographs which have been electronically retouched or otherwise modified and then copied onto fresh colour film to yield a clean 'original' which may be sent to other locations and subsequently scanned on a colour separation scanner. The Dr. Rudolf Hell Gmbh Colour Proof Recorder CPR403 which outputs continuous tone, colour hardcopy on standard colour paper or transparency is presently in use for the production of such second generation originals.

It has now been found that a colour proof recording system such as that disclosed in British Patent Application GB No. 2172118A can be modified to include the possibility of producing continuous tone second generation colour originals.

In this case the image produced should match, as closely as possible, the original which may be a colour transparency on Kodak Ektachrome film or corresponding materials. Only a three colour material is therefore required (yellow, magenta and cyan). To produce continuous tone images the LED arrays must be controlled so that they may be driven at any power levels between the limits giving Dmax and Dmin. Therefore in order to maximise reproducibility of tonal values, the exposure range of the individual sensitive layers of the material should match the practical intensity range of the LED sources.

SUMMARY OF THE INVENTION

Therefore according to the present invention there is provided a process for producing a continuous tone colour image which comprises providing a light sensitive photographic element comprising a substrate bearing three imaging media coated thereon, said imaging media comprising:

(1) an imaging medium capable of forming a yellow image upon imagewise exposure and processing, (2) an imaging medium capable of forming a magenta image upon imagewise exposure and processing, (3) an imaging medium capable of forming a cyan image upon imagewise exposure and processing, each imaging medium having a maximum spectral sensitivity at a wavelength different from that of the maximum spectral sensitivity of the other imaging media within the range 550 to 900 nm, the sensitivities at the wavelength of maximum spectral sensitivity of the media decreasing in order from the medium of shortest wavelength maximum spectral sensitivity to the medium of longest wavelength maximum spectral sensitivity, the difference in said sensitivities between the media of shortest and longest wavelengths maximum spectral sensitivity being greater than 0.8 log exposure units, preferably greater than 1 log exposure unit, more preferably greater than 1.3 log exposure units, exposing said element to three independently modulated sources each emitting radiation of a wavelength corresponding to the wavelength of maximum sensitivity of a respective imaging medium, the maximum emission intensities of the sources at the wavelength of their maximum output increasing from the source of shortest wavelength to longest wavelength by an amount corresponding to the sensitivity difference of the imaging medium, said exposures being conducted in scanning, preferably raster fashion and over a number of discrete exposure levels.

The elements used in the invention are exposed by the three independent sources of different wavelengths and image formation in each layer is attributable only to a single source.

The elements of the invention are based on an entirely different principle to conventional colour photographic silver halide elements. Conventional elements produce a colour image by combinations of cyan, magenta and yellow dyes and the wavelength of the exposing radiation causes image formation with a dye having the same wavelength within its principal absorption band. The elements of the present invention utilize false-colour address in order to separate magenta, cyan and yellow. Thus the wavelength of the exposing source used to indicate a particular photosensitive layer may be entirely independent of the colour generated in that layer. For example, a magenta separation may be digitised and thereafter cause an infra-red emitting source to expose an imaging layer sensitive to infra-red. This material, on processing, generates a magenta image.

Hitherto false-colour address has been used only for specialised image recording, e.g. infra-red aerial photography and X-ray photography with the exception of the elements disclosed in U.S. Pat. No. 4,619,892. That patent discloses full colour photographic images are produced by exposure of a radiation-sensitive element comprising at least three silver halide emulsion layers, at least two of which silver halide emulsion layers are sensitised to infrared radiation. Selectively absorptive filter layers and/or differential sensitivities between emulsion layers are used to prevent exposure of other layers to radiation used to expose a single layer.

Thus many of the photographic elements suitable for use in the invention are new and according to a further aspect of the invention there is provided a light sensitive photographic element comprising a substrate bearing three imaging media coated thereon, said imaging media comprising:

(1) an imaging medium capable of forming a yellow image upon imagewise exposure and processing, (2) an imaging medium capable of forming a magenta image upon imagewise exposure and processing, (3) an imaging medium capable of forming a cyan image upon imagewise exposure and processing, each imaging medium having a maximum spectral sensitivity at a wavelength different from that of the maximum spectral sensitivity of the other imaging media within the range 550 to 900 nm, the sensitivities at the wavelength of maximum spectral sensitivity of the media decreasing in order from the medium of shortest wavelength maximum spectral sensitivity to the medium of longest wavelength maximum spectral sensitivity, the difference in said sensitivities between the media of shortest and longest wavelength maximum spectral sensitivity being greater than 0.8 log exposure units, not more than one imaging media being sensitised to infrared radiation and at least one of the imaging media having a wavelength of maximum spectral sensitivity which does not lie within the principal absorption wavelength band of the dye used to form the colour image generated in that layer.

Preferably at least two of the imaging layers are sensitised to wavelengths which do not lie within the principal absorption bands of the dye used to form the colour image generated in the layers. It is one optional aspect of the present invention to have the maximum spectral sensitivity of one of the imaging media in the infrared.

The imaging media of the elements of the invention are selected such that not only does each medium have a maximum spectral sensitivity at a wavelength which is different from the wavelengths of maximum spectral sensitivity of the other imaging media but each imaging medium has a sensitivity at the wavelengths of maximum spectral sensitivity of the other imaging media which is not significant so that upon image-wise exposure of the element to radiation of a wavelength corresponding to the maximum spectral sensitivity of one of said imaging media of sufficient intensity to cause image formation in that medium image formation will be confined to said one imaging medium. Thus, upon irradiation by three independent sources having emission wavelengths in the region of the maximum spectral sensitivity of the layers and subsequent processing, the elements of the invention form super-imposed yellow, magenta and cyan images, each image being attributable to the image-wise exposure of the respective source.

By exposing the element to three independently modulated sources each emitting radiation of a wavelength corresponding to the wavelength of maximum sensitivity of a respective medium is meant exposing under conditions where the source's emission generally corresponds to the maxiumum absorbance of the sensitising dye. This may include a precise correspondence of emission and absorption wavelengths or slight mismatch. The difference between the wavelength of maximum emission of the source and the maximum absorbance of the sensitising dye will normally be less than 40 nm, preferably less than 20 nm, most preferably less than 10 nm. It will be appreciated that the source may be monochromatic e.g. as in laser exposure, or it may emit over a narrow band e.g. emitting diode exposure. Additionally the sensitising dyes may have relatively sharp or broader absorbances. Where a sensitising dye has a sharp absorbance the mismatch tolerance with the source will be reduced. Typically sensitising dyes used at 580 nm will have a sharper cut-off at longer wavelength than those used at 800 nm. In practice a corresponding source and sensitising dye will be chosen so that the source will cause significant exposure of the sensitised layer but not significant exposure of any other layers. Generally a source would be chosen to emit on or close to the wavelength of maximum spectral sensitivity of the layer with the sensitivity of the sensitising dye at the wavelength of maximum emission of the source dropping by not more than 0.4 logE preferably not more than 0.1 logE, most preferably not more than 0.05 logE relative to the maximum spectral sensitivity possessed by the sensitised layer.

The process of the invention involves exposing the element in scanning fashion over a number of discrete exposure levels. The number of exposure levels will be at least 8 preferably at least 64 and most preferably at least 256. The greater the number of intensity levels the closer will be the approximation to a conventional continuous tone exposure in which intensity can vary in an essentially analogue fashion.

In order to achieve good continuous tone response in the process of the invention each source, normally a visible or infrared light emitting diode, will be controllable over at least 8 intensity levels. If a large number of, say 256, intensity levels are achievable from the circuitry, it may be desirable to group these so that, say, only 64 levels are actually used for exposure. This allows some further control over the output to allow for non-linear relationships in the input current and output illumination of the sources and non-linearity of sensitometric response of the emulsions.

Alternatively, circuitry can be used in which non-uniform increments in drive current are utilised so as to compensate for the non-linear relationship between the input current and output illumination of the sources and non-linearity of sensitometric response of the emulsions. Normally the intensity of emission is controlled by altering the current.

In the preferred process of the invention the scanning is undertaken in raster fashion with constant scanning rate and the intensity of the source being controlled to a number of discrete intensities i.e. the exposure time for each pixel is constant. It is however possible to combine variations in exposure time with a constant source intensity so that a number of discrete exposure levels are achieved. Also both exposure time and intensity may be varied to give a number of discrete exposure levels.

As an alternative to raster scanning, vector scanning may also be used.

The individual emissions of the exposing devices are selected from the range 550 to 900 nm. This region allows safelight handling of the elements in blue/green light. If required the element may additionally be provided with a bleachable yellow filter to improve safelighting properties. A further reason for the preferential choice of green, yellow, red and infrared emitting sources is the ready availability of relatively high powered semiconductor devices in this region. Suitable, commercially available exposing sources include:

555 nm: a green light emitting diode (LED), part No. ESAY 3431 available from Stanley Electric Co.

580 nm: a yellow emitting LED, part No. ESB 63401 available from Stanley Electric Co.

660 nm: a light emitting diode, part No. H2K commercially available from Stanley Electric Company, Semiconductor Division, Japan 735 nm: an emitting diode, part No. HLP40RA, commercially available from Hitachi Electronic Components (UK) Limited, 221-225 Station Road, Harrow, Middlesex 780 nm: an infrared emitting diode (IRED), part No. HLP60RB, commercially available from Hitachi Electronic Components (UK) Limited, and a laser diode, part No. LT-024MD, commercially available from Sharp Corporation, Osaka, Japan 830 nm: an infrared emitting diode (IRED), part No. HLP60RC, commercially available from Hitachi Electronic Components (UK) Limited, and a laser diode, part No. LT-015MD, commercially available from Sharp Corporation, Osaka, Japan.

The layers may also be exposed by radiation from 550 to 900 nm suitably filtered to allow passage of only a narrow band of radiation to simulate the solid state source emissions, and matching the wavelengths of maximum sensitivity of one or more of the colour forming layers. Such exposures may be undertaken in the contact mode.

The image-forming layers represented in the elements of the invention are preferably silver halide emulsions which may form part of a silver dye-bleach process or may give rise to dye images by a colour coupling process or a dye diffusion transfer process. Silver dye-bleach systems which are positive acting are preferred. The density and hue of the various layers may be controlled more easily during film manufacture.

Silver dye-bleach, dye diffusion transfer and colour coupler imaging systems are well known and are disclosed, for example, in "The Theory of the Photographic Process", 4th Edition, Mees & James, Macmillan Publishing Co. Inc., pages 353 to 372, "Dye Diffusion Systems in Colour Photography", Van de Sande, Angew. Chem. Int. Ed. Engl. 22 (1983), pages 191 to 209, and "Imaging Systems", Jacobson & Jacobson, Focal Press, 1976 pages 86 to 103.

Image forming layers of the dye diffusion transfer type rely on the imagewise diffusion of preformed dyes from the imaging layer to a mordant containing receptor layer. The final coloured image is formed in the receptor layer which may subsequently be separated from the imaging layer. A comprehensive review of chemical mechanisms by which imagewise dye diffusion may be achieved is given, for example, in "Dye Diffusion Systems in Colour Photography" Angewandte Chemie International Edition 1983, 22, 191–209. The preferred types of dye diffusion transfer for the practice of this invention are:

The system employing 'dye developers' which are dye molecules linked to one or more hydroquinone developing moiety. This is described in detail in "The Chemistry of Synthetic Dyes", K. Venkataraman, Vol. VIII, Chapter 8, New York, Academic Press, 1978.

The system employing "Redox dye release" molecules such as those of the ortho- or parasulphonamidophenol or sulphonamidonaphthol types described, for example, in "The Theory of the Photographic Process", T. H. James, 4th Edition, page 370 New York, Macmillan, 1977.

The system employing sulphonomethylene derivatives of quinones as described in European Patent Application No. 4,399.

Image forming layers of the colour coupler type rely on the colour forming reaction between a 'colour coupler' which is usually incorporated in the imaging layer and oxidised colour developing agent. A review of materials which may be used in constructions of this type is given in "Research Disclosure" Vol. 187 item 18716, 1979.

Other types of image forming layer which may be employed comprise leuco dye oxidation systems.

In addition to the photosensitive image-forming media described above it is also possible to employ colour photothermographic media of the dry silver type, such as disclosed in U.S. Pat. No. 4,460,681. Silver halide photothermographic imaging materials essentially comprise a light insensitive, reducible silver source, a light sensitive material which generates silver when irradiated and a reducing agent for the silver source. The light sensitive material is generally photographic silver halide which must be in catalytic proximity to the light insensitive silver source. The silver sources used in this area of technology are materials which contain silver ions, the earliest and still preferred source comprising silver salts of long chain, carboxylic acids usually of from 10 to 30 carbon atoms, the silver salt of behenic acid or mixtures of acids of lighter molecular weight have been primarily used. It is possible to prepare multi-colour, photothermographic imaging articles by providing various colour forming layers maintained distinct from each other on generally a film base.

In conventional colour photographic materials it is usual for each of the three sensitive layers to form a dye image which is complementary in colour to the light to which that layer is sensitive. In the present invention the image forming layers may generate an image the colour of which is unrelated to that of the exposing source. Thus, subject to some restrictions, each of the three colour image-forming layers of the present invention may be sensitive to any of the three exposing wavelengths chosen. Furthermore, several variations in the order of coating the layers on the base are possible. In the case of a colour, silver dye-bleach material some restrictions are imposed by the presence of the image dyes during exposure. Any layers which are sensitive to wavelengths shorter than about 700 nm may usefully be nearer to the exposing source than the layer which contains the cyan dye.

The layer which contains the cyan dye, if suitably placed, may act as a filter layer to increase the colour separation between any layers sensitive to radiation with wavelengths shorter than 700 nm and any layers with wavelength longer than 700 nm. Additional bleachable filter layers may be coated above the sensitive layers in order to improve the safelight handling of the construction. These filter layers may contain bleachable dyes or, in the case of a silver dye-bleach construction, yellow colloidal silver which may also be in combination with an azo dye.

The light sensitive layers may be coated on any suitable opaque or transparent base. Generally optically transparent plastic films may be employed such as polyester film, preferably biaxially orientated poly(ethylene terephthalate) film. This film may contain subbing or priming coats. The net construction after imaging and development would be viewed by transmission. Alternatively the imaging media may be coated on an opaque substrate such a photographic grade baryta or resin coated paper, or a pigmented plastic film such as titanium dioxide pigmented polyester film. For best viewing in reflected light the base should be optically white. The construction preferably incorporates an antihalation backing, or in the case of opaque base an antihalation underlayer. The antihalation layer may contain bleachable dyes or black colloidal silver may be used, or a strippable layer of pigment e.g. carbon black, and mixtures of dyes may be used.

A wide variety of sensitising dyes may be used to sensitise the individual photosensitive layers to yellow, red and near infrared light; these have been well documented in the literature. There is no particular restriction as to the composition of the silver halide emulsion which may be used in this invention.

As described above, the radiation-sensitive elements of the invention may be exposed by three independent sources of actinic radiation which are modulated to represent the particular colour requirement of the desired image. Whilst the exposures may take place sequentially it is preferred that the elements are exposed to the sources simultaneously in order to avoid the necessity for scanning the elements upon three separate occasions. By scanning is meant passage of the actinic radiation over the media in raster or vector fashion.

An element is scanned in a raster fashion either by moving the element rapidly in one direction whilst the exposing beams are moved more slowly in a perpendicular direction, or by moving the writing beams rapidly in one direction whilst the element is moved more slowly in a perpendicular direction, or by moving the writing beams rapidly in one direction and more slowly in a perpendicular direction. Preferably a combination of sources of the same wavelength is used for exposure so that array lightspots of each wavelength are formed on the material. This permits faster scanning rates.

Alternatively the process of vector scanning may be employed. In this case the individual pixels are not necessarily exposed by orthogonal movement of the exposing beams as pixels may be exposed by a diagonal or circular or other relative movement of the sources. Such vector scanning is well known in so called computer driven pen plotters. This vector fashion scanning is suitable for line drawing reproduction. Normally raster scanning will be the preferred mode.

Scanners employing laser diode or light emitting diode exposure sources which are driven by digitised records of the colour information for each pixel are known in the printing industry and typically are of the rotary or flat-bed types.

For the practice of this invention each of the three sources may be independently selected from visible light emitting diodes, infrared emitting diodes, visible light emitting laser diodes or infrared emitting laser diodes. Gas and other lasers or narrow band sources may be used although they are less preferred. The radiation from the sources may be passed by optical passing arrangements to the film plane, optionally including optical fibre transmission.

Most preferred for the practice of the invention are the multi-wavelength LED and IRED arrays described in British Patent Application No. GB 2172118A which have advantages in compactness.

EXAMPLE 1

A three colour material was prepared as follows in which the magenta, cyan and yellow image forming layers of the silver dye bleach type were sensitised to 580, 660 and 750 nm radiation (respectively) and coated as a "tripack" i.e. a three layer construction.

Emulsion A was a silver chlorobromide emulsion comprising 70 mole percent of AgCl and 30 mole prcent of AgBr of mean grain size 0.4 micron and with a narrow grain size distribution prepared by a conventional double-jet technique. The emulsion was sulphur and gold sensitised and stabilised with a tetra-azaindene compound.

A. Preparation of magenta image forming layer (M layer)

0.06 mole of the Emulsion A was spectrally sensitized to radiation of 580 nm with 9 mg of sensitising dye of structure 1.

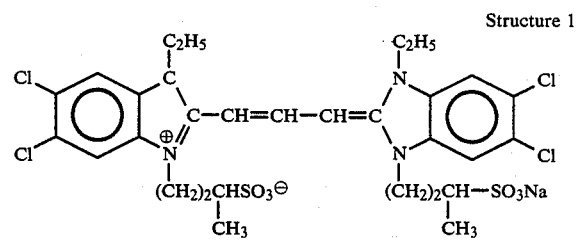

Structure 1

The following additions were made to the spectrally sensitised emulsion:
180 g of 10% gelatin solution
4.5 ml of 4% TRITON X-200 solution (a sodium salt of alkylarylpolyether sulphonate commercially available from Rohm and Haas)
4.5 g of magenta azo dye (Structure 2) as a 3% aqueous solution
9 ml of 4% formaldehyde solution The pH was adjusted to 6.0 and the total weight of the solution made up to 600 g.

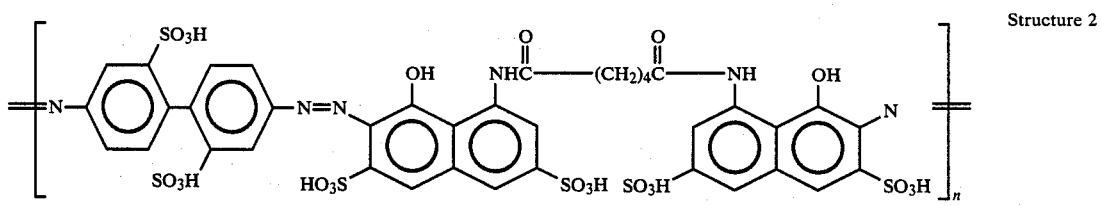

Structure 2

B. Preparation of cyan image forming layer (C layer)

0.03 moles of Emulsion (A) was spectrally sensitised to radiation of 660 nm with 6 mg of a sensitising dye of Structure 3. The cyan forming layer was prepared with the same coating additions as layer M except that the magenta dye was replaced by 1.56 g of a cyan azo dye Structure 4, added as a 2% aqueous

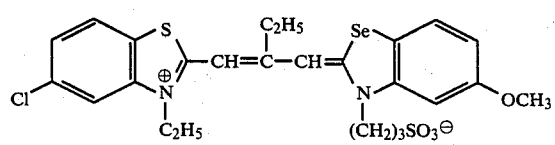

Structure 3

-continued

Structure 4

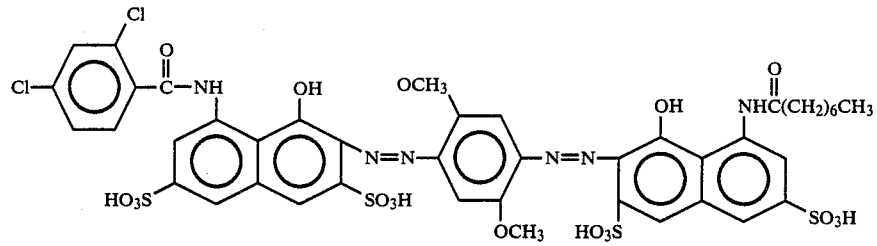

C. Preparation of yellow image forming layer (Y layer)

0.028 mole of Emulsion (A) was spectrally sensitised to radiation of 750 nm with 0.7 g of sensitising dye of Structure 5. The yellow forming layer was prepared similarly to layer M except that the magenta azo dye was replaced with 1.38 g of a yellow azo dye (Structure 6), added as a 2% aqueous solution.

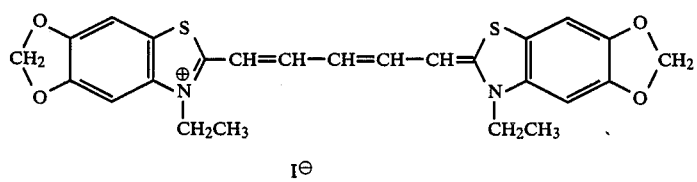

Structure 5

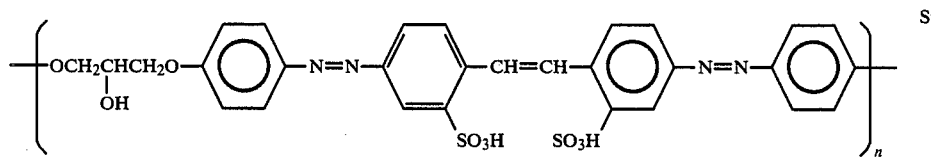

Structure 6

The sensitised emulsions were coated onto white polyester base in the following order with the silver coverages indicated:

|     |               |                           |
| --- | ------------- | ------------------------- |
| 1st | Yellow Layer  | (0.2 g Ag/m$^2$)          |
| 2nd | Cyan Layer    | (0.2 g Ag/m$^2$)          |
| 3rd | Magenta Layer | (0.2 g Ag/m$^2$)          |

Gelatin spacer layers (2 micron dry thickness) were included between the sensitised layers and a gelatin overcoat was applied on top.

By exposure using filtered sources emitting at 580, 660 and 750 nm followed by conventional silver dye bleach processing it was found that the yellow layer could be completely bleached by 750 nm radiation without affecting the density of the other two layers.

Similarly the cyan layer could be completely bleached by 660 nm light and the magenta layer by 580 nm light.

Exposures of the three colour material were made in a sensitometer to radiation from a tungsten lamp attenuated by narrow band pass interference filters of 580, 660 and 730 nm. The sensitometric characteristics of each colour layer were determined by first exposing the other colour layers to suffficient radiation of the appropriate wavelengths to completely bleach these layers and then to expose the subject layer through a 0 to 4 continuous neutral density wedge, and the appropriate interference filter to obtain a continuous density versus log exposure response.

The exposed samples were developed in 3M RDC rapid access developer for 20 seconds at 40° C., then treated with Ilford Cibachrome P22 dye bleach and fix solutions both for 40 seconds and at 40° C.

The sensitivities in ergs/cm$^2$ to give a density of 0.1 above Dmin, of the colour forming layers at their wavelength of maximum sensitivity are given below.

| MAGENTA LAYER | 580 nm | 1.7 ergs/cm$^2$  |
| ------------- | ------ | ---------------- |
| CYAN LAYER    | 660 nm | 5.9 ergs/cm$^2$  |
| YELLOW LAYER  | 730 nm | 41.3 ergs/cm$^2$ |

This data demonstrates that the sensitivities of the layers decrease in order from the sensitive layer of shortest wavelength to the sensitive layer of longest wavelength and that the difference in sensitivity between the shortest and longest wavelength layers is 1.4 log exposure units.

This coating would therefore be suitable for the practice of this invention. The filtered sources are designed to represent the emissions of solid state sources which would normally be employed in scanning fashion.

EXAMPLE 2

A three colour layer material exposed in continuous tone by an LED scanner

A three colour material was prepared as follows in which the yellow, cyan and magenta image forming layers of the silver dye bleach type were sensitised to 580, 660 and 800 nm radiation respectively and coated as a three colour layer construction.

The conventional negative-acting silver halide emulsion (Emulsion B) used in each of the three colour forming layers was a silver iodochlorobromide containing 1.2 mole percent iodide, 14.3 mole percent chloride and 84.5 mole percent bromide and with an average grain size of 0.7 micron. The emulsion was sulphur and gold sensitised and stabilised with a tetra-azaindene stabiliser.

A. Preparation of the yellow image forming layer (Layer Y)

0.014 mole of the Emulsion B was spectrally sensitised to radiation of 580 nm with 4.9 mg of sensitising dye of Structure 1. The following additions were made to the spectrally sensitised emulsion;
120 g of 10% gelatin solution,
6 ml of 2% TRITON X-200 solution (a sodium salt of alkylarylpolyether sulphonate commercially available from Rohm and Haas),
0.9 g of yellow azo dye (Structure 6) as a 2% aqueous solution,
3.6 ml of 2% formaldehyde solution.
The pH adjusted to 5.8 and the total weight of the solution made up to 400 g.

B. Preparation of the cyan image forming layer (Layer C)

0.02 mole of the Emulsion B was spectrally sensitised to radiation of 660 nm with 8.75 mg of sensitising dye of Structure 7.

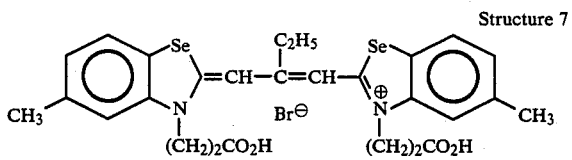

Structure 7

The cyan forming layer was prepared with the same coating additions as Layer Y except that the yellow azo dye was replaced by 1.2 g of a cyan azo dye (Structure 4), added as a 2% aqueous solution.

C. Preparation of the magenta image forming layer (Layer M)

0.027 mole of the Emulsion B was spectrally sensitised to radiation of 800 nm with 0.4 mg of sensitising dye of Structure 8.

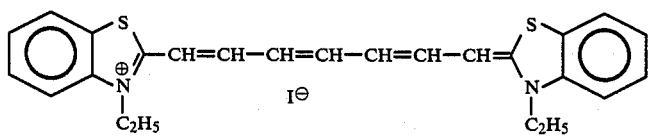

Structure 8

The magenta forming layer was prepared with the same additions as Layer Y except that the yellow azo dye was replaced by 3 g of a magenta azo dye (Structure 2), added as a 2% aqueous solution.

D. Construction of 3-colour layer material

The three colour image forming layers were coated consecutively onto a white polyester base, which was itself coated with a black colloidal silver in gelatine layer, providing anti-halation protection throughout the visible and the near infra-red region of the spectrum. This colloidal silver layer is removed during the dye-bleach processing cycle.

The layer order was such that the cyan colour layer was nearest to the substrate, followed by the magenta and yellow. The layers were coated to give the following silver coverages.
Yellow layer: 0.2 g/m$^2$
Magenta layer: 0.4 g/m$^2$
Cyan layer: 0.3 g/m$^2$
Gelatin interlayers of 2 micron dry thickness were coated between adjacent colour layers and between the cyan layer and the colloidal silver anti-halation layer. The yellow layer was overcoated with a 0.6 micron thick protective gelatin layer.

E. Measurement of Photographic Properties

The three colour layer material was exposed in a raster fashion on a modified colour separation scanner by means of three separate LED arrays, each consisting of 10 elements, emitting at 580, 660 and 800 nm. Each exposing LED array was independently modulated to give 16 discrete intensity levels by a variation of the input current.

Blocks of single colours of varying density were produced in each of the individual colour layers by first exposing the other two colour layers to sufficient radiation of the appropriate wavelength to completely bleach these layers and then exposing the subject layer with 16 discrete intensity levels of the appropriate LED array. For instance, to produce blocks of yellow of various densities, the cyan and magenta layers were first exposed with sufficient radiation from the 660 and 800 nm LED arrays respectively to cause complete bleaching of these layers, the yellow layer was then exposed by varying the 580 nm array over 16 input current values.

After exposure the sample was developed in 3M RDC rapid access developer at 40° C. for 30 seconds, treated with Ilford Cibachrome P22 dye bleach and fix solutions at 40° C. for 60 seconds each, washed and dried. The densities produced in each of the colour layers for the 16 intensity levels were measured by a Gretag D142-3 densitometer with Kodak Wratten 29, 61 and 47B filters to measure cyan, magenta and yellow respectively, and are reported in Table 1.

TABLE 1

| Yellow Layer 580 nm Array | | Cyan Layer 660 nm Array | | Magenta Layer 800 nm Array | |
|---|---|---|---|---|---|
| current (mA) | density | current (mA) | density | current (mA) | density |
| 6.4 | 1.23 | 4.2 | .93 | 1.4 | 1.09 |
| 9.6 | 1.23 | 6 | .93 | 1.4 | 1.09 |
| 12.8 | 1.23 | 8 | .80 | 1.8 | 1.09 |
| 16.8 | 1.16 | 10.2 | .65 | 3.2 | 1.09 |
| 21.2 | 1.03 | 12.0 | .50 | 5.4 | 1.09 |
| 26 | .85 | 14.0 | .38 | 8.2 | 1.08 |
| 31.2 | .67 | 16.2 | .28 | 11.0 | 1.03 |
| 36.4 | .53 | 18.4 | .20 | 14.2 | .92 |
| 41.6 | .39 | 20.6 | .14 | 17.2 | .79 |
| 46.8 | .29 | 22.6 | .13 | 20.4 | .61 |
| 52.4 | .27 | 25.0 | .09 | 23.4 | .42 |
| 58.0 | .22 | 27.2 | .07 | 26.6 | .25 |
| 63.6 | .18 | 29.6 | .06 | 29.8 | .15 |

TABLE 1-continued

| Yellow Layer 580 nm Array | | Cyan Layer 660 nm Array | | Magenta Layer 800 nm Array | |
|---|---|---|---|---|---|
| current (mA) | density | current (mA) | density | current (mA) | density |
| 69.6 | .16 | 32.8 | .05 | 33.0 | .11 |
| 75.2 | .16 | 34.6 | .04 | 36.2 | .10 |
| 80.8 | .15 | 36.8 | .03 | 39.4 | .10 |

The three colour material was exposed on the three LED array colour scanner to produce acceptable three colour continuous tone prints, demonstrating that the material possessed adequate colour separation between the layers.

The radiation outputs of the three LED arrays at 580, 660 and 800 nm are in the ratio 1:16:60, so that from Table 1 it can be deduced that the sensitivities of the layers measured at a density of 0.1 above Dmin decrease in order from the sensitive layer of shortest wavelength to the sensitive layer of longest wavelength. The yellow 580 nm layer is 0.8 log Exposure units more sensitive than the cyan 660 nm layer and the cyan layer is 0.7 log Exposure units faster than the magenta 800 nm layer, so that the difference in sensitivity between the shortest and longest wavelength layers is 1.5 log Exposure units.

EXAMPLE 3

Colour Dry Silver Medium

A cyan image producing, photothermographic layer, sensitive to 660 nm radiation, suitable as one layer of a continuous tone three colour recording material for exposure by scanned LED arrays was prepared as follows.

A dispersion of silver behenate half soap was made at 10% solids content in toluene by high pressure homogenisation. To 270 g of the half soap was added ethanol (160 g) and methanol (160 g). Polyvinyl butyral (0.4 g) was added followed by mercuric bromide (10 ml of 3.5% solution in methanol).

Further polyinyl butyral was added (48 g) after 2 hours. To 25 g of this mixture was added:
Pergascript Turquoise S-2G (Ciba Geigy) (0.25 g) sensitising dye (2 ml of 0.04% solution in methanol).

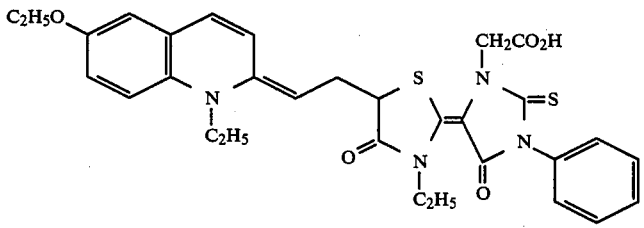

The resulting solution was coated at 75 microns wet thickness and dried at 90° C. for five minutes.
The coating was overcoated with a solution containing:
Ethanol 15 ml
phthalic acid 14 g
cellulose acetate butyrate 14 g (15% solution in ethanol)
at a wet thickness of 75 microns and dried as before.

A sample of the coating was exposed to light of 660 nm, produced from monochromated white light tungsten filament source.

The sample was processed by heating at 125° C. for 15 seconds to produce a cyan image in the exposed area.

The sensitivity of the material to 660 nm radiation was measured at 80 ergs/$cm^2$ for a density of 0.1 above base plus fog.

This level of sensitivity makes the layer suitable for imaging in a scanning mode by a solid state source such as an LED.

We claim:

1. A process for producing a continuous tone colour image comprising providing a light sensitive photographic element comprising a substrate bearing three imaging media coated thereon, said imaging media comprising:
    (1) an imaging medium capable of forming a yellow image upon imagewise exposure and processing,
    (2) an imaging medium capable of forming a magenta image upon imagewise exposure and processing,
    (3) an imaging medium capable of forming a cyan image upon imagewise exposure and processing, each imaging medium having a maximum spectral sensitivity at a wavelength different from that of the maximum spectral sensitivity of the other imaging media within the range 550 to 900 nm, the sensitivities at the wavelength of maximum spectral sensitivity of the media decreasing in order from the medium of shortest wavelength maximum spectral sensitivity to the medium of longest wavelength maximum spectral sensitivity, the difference in said sensitivities between the media of shortest and longest wavelength maximum spectral sensitivity being greater than 0.8 log exposure units,
    exposing said element to three independently modulated sources each emitting radiation of a wavelength in the region of the wavelength of maximum sensitivity of a respective imaging medium, the maximum emission intensities of the sources at the wavelength of their maximum output increasing from the source of shortest wavelength to longest wavelength by an amount corresponding to the sensitivity difference of the imaging media, said exposures being conducted in scanning fashion and over at least light discrete exposure levels.

2. A process as claimed in claim 1 in which the difference in said sensitivities between the media of shortest and longest wavelength maximum spectral sensitivity is greater than 1.0 log exposure units.

3. A process as claimed in claim 2 in which the difference in said sensitivities between the media of shortest and longest wavelength maximum spectral sensitivity is greater than 1.3 log exposure units.

4. A process as claimed in claim 1 in which the exposures are conducted over at least 8 discrete exposure levels.

5. A process as claimed in any preceding claim in which scanning is conducted in raster fashion.

6. A process as claimed in claim 2 in which scanning is conducted in raster fashion.

7. The process of claim 1 in which the exposures are made over at least sixty-four exposure levels.

8. The process of claim 2 in which the exposures are made over at least sixy-four exposure levels.

9. The process of claim 6 in which the exposures are made over at least 256 exposure levels.

10. The process of claim 1 in which the exposures are made over at least 256 exposure levels.

11. A light sensitive photographic element comprising a substrate bearing three imaging media coated thereon, said imaging media comprising:
   (1) an imaging medium capable of forming a yellow image upon imagewise exposure and processing,
   (2) an imaging medium capable of forming a magenta image upon imagewise exposure and processing,
   (3) an imaging medium capable of forming a cyan image upon imagewise exposure and processing, each imaging medium having a maximum spectral sensitivity at a wavelength different from that of the maximum spectral sensitivity of the other imaging media within the range 550 to 900 nm, the sensitivities at the wavelength of maximum spectral sensitivity of the media decreasing in order from the medium of shortest wavelength maximum spectral sensitivity to the medium of longest wavelength maximum spectral sensitivity, the difference in said sensitivities between the media of shortest and longest wavelength maximum spectral sensitivity being greater than 0.8 log exposure unit, not more than one imaging media being sensitised to infrared radiation and at least one of the imaging media have a wavelength of maximum spectral sensitivity which does not lie within the principal absorption wavelength band of the dye used to form the colour image generated in that layer.

12. A light sensitive photographic element as claimed in claim 11 in which at least two of the imaging media have a wavelength of maximum spectral sensitivity which do not lie within the principal absorption bands of the dye used to form the the colour image generated in that layer.

13. A light sensitive photographic element as claimed in claim 12 in which the wavelength for maximum spectral sensitivity of one of the imaging media is in the infra-red.

14. A light sensitive photographic element as claimed in claim 11 in which the difference in said sensitivities between the media of shortest and longest wavelength maximum spectral sensitivity is greater than 1.0 log exposure units.

15. A light sensitive photographic element as claimed in claim 14 in which the difference in said sensitivities between the media of shortest and longest wavelength maximum spectral sensitivity is greater than 1.3 log exposure units.

16. A light sensitive photographic element as claimed in claim 12 in which the difference in said sensitivities between the media of shortest and longest wavelength maximum spectral sensitivity is greater than 1.0 log exposure units.

17. A light sensitive photographic element as claimed in claim 13 in which the difference in said sensitivities between the media of shortest and longest wavelength maximum spectral sensitivity is greater than 1.0 log exposure units.

* * * * *